(12) United States Patent
Nakasu et al.

(10) Patent No.: US 6,198,679 B1
(45) Date of Patent: Mar. 6, 2001

(54) SEMICONDUCTOR MEMORY DEVICE

(75) Inventors: Teruhiko Nakasu, Ushiku; Shigeki Tomishima; Tsukasa Ooishi, both of Tokyo, all of (JP)

(73) Assignees: Texas Instruments Incorporated, Dallas, TX (US); Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/408,717

(22) Filed: Sep. 29, 1999

(30) Foreign Application Priority Data

Sep. 29, 1998 (JP) ................................................ 10-291490

(51) Int. Cl.⁷ ...................................................... G11C 7/00

(52) U.S. Cl. ........................... 365/203; 365/207; 365/233

(58) Field of Search ................................. 365/189.01, 207, 365/203, 233

(56) References Cited

U.S. PATENT DOCUMENTS 6,058,044 * 5/2000 Sugiura ................................ 365/203

* cited by examiner

*Primary Examiner*—Terrell W. Fears
(74) *Attorney, Agent, or Firm*—William B Kempler; Frederick J. Telecky, Jr.

(57) ABSTRACT

The objective of the invention is to read and write data in synchronization with a high-speed clock signal. The pulse width of the timing control signal (FY signal), which determines the pulse width of the column select signal (YS signal), is enlarged in a data read operation and reduced in a data write operation. In this way, the activation pulse width of the column select signal is enlarged in a data read operation and reduced in a data write operation. Consequently, in a data read operation, the time for connecting a bit line pair to an input/output line pair becomes longer. The potential difference of the bit line pair can be completely transferred to the input/output line pair. Therefore, data can be read correctly in synchronization with a high-speed clock signal.

8 Claims, 8 Drawing Sheets

SEMICONDUCTOR MEMORY DEVICE

FIELD OF THE INVENTION

The present invention pertains to a semiconductor memory device. In particular, the present invention pertains to dynamic RAM (DRAM) that reads and writes data in synchronization with an external clock signal.

BACKGROUND OF TEE INVENTION

In recent years, there has been a demand on reading and writing data at a high speed from and into semiconductor memory devices, such as dynamic RAM. Synchronous dynamic RAM that can read and write data in synchronization with an external clock signal has been developed to meet the aforementioned demand. In such synchronous dynamic RAM, a command is input based on a logical combination of signals, such as CS (chip select), RAS (row address strobe), CAS (column address strobe), WE (write enable), etc. In an operation mode corresponding to the command, data are read or written in synchronization with an external clock signal.

As described above, a synchronous dynamic RAM reads and writes data in synchronization with an external clock. As the frequency of the clock signal increases, e.g. to 125 MHz, 133 MHz, or 143 MHz, the operating speed of the internal circuit of the synchronous dynamic RAM must also increase in step with this increase in clock frequency. For example, when the frequency of the external clock signal is 125 MHz, data must be read or written consecutively every 8 ns (nanosecond) in burst mode. When the frequency of the external clock signal is 133 MHz data must be read or written consecutively every 7.5 ns in burst mode. When the frequency of the external clock is 143 MHz, data must be read or written consecutively every 7 ns in burst mode.

The objective of the present invention is to provide a semiconductor memory device that can read and write data at a high speed.

SUMMARY OF THE INVENTION

In order to realize the aforementioned purpose, the present invention provides a semiconductor memory device characterized by the following facts: the semiconductor memory device has a memory array composed of plural memory cells arranged at the positions where plural bit line pairs cross plural word lines, plural sense amplifiers that are electrically connected to the aforementioned plural bit line pairs, respectively, and are used to determine the potential difference between the aforementioned bit line pairs, input/output line pairs that are used to transfer the data read from the aforementioned memory cells and the data to be written into the memory cells, plural first switch circuits that electrically connect the aforementioned plural sense amplifiers to the aforementioned input/output line pairs, respectively, a timing control signal generating circuit that is used to generate a timing control signal, a row decoder circuit that activates one of the aforementioned plural word lines corresponding to a row address signal, and a column decoder circuit that provides a column select signal used to activate a desired first switch circuit from the aforementioned plural first switch circuits corresponding to the aforementioned timing control signal and a column address signal; during a data write operation, the pulse width of the aforementioned timing control signal is set so that it is shorter than the pulse width of the timing control signal during a data read operation; during a data write operation, the width of the pulse used to activate the aforementioned column select signal is shorter than the width of the pulse used to activate the column select signal during a data read operation.

In the present invention, the pulse width of the timing control signal (FY signal) that determines the pulse width of the column select signal (YS signal) is different during a data read operation than during a data write operation. During a data read operation, the width of the pulse used to activate the column select signal is enlarged. The time needed for the bit line pair to be connected to the input/output line pair and for the sense amplifier to determine the potential difference is prolonged so that a sufficient potential difference appears at the input/output line pair. During a data write operation, the width of the pulse used to activate the column select signal is reduced. The time needed for initializing the input/output line pair, that is, the precharge time, is prolonged so that the input/output line pair can be completely initialized. Consequently, data can be read correctly during both a write and read operation synchronized with a high-speed clock signal.

REFERENCE NUMERALS AND SYMBOLS AS SHOWN IN THE DRAWINGS

In the figures, 100 represents a semiconductor chip, 110 a column decoder, 112 a main word driver, 120 and 122 subword drivers, 130 and 132 sense amplifier banks, 600 and 700 FY signal generators, 70A and 70B delay circuits, 800 a FY signal adjusting circuit, 83 a write timing adjusting circuit, 84 a read timing adjusting circuit, 90 a timing adjusting circuit, 88 and 89 delay circuits, MB a memory bank, MA a memory array, MC a memory cell, SA a sense amplifier, BL and BLB bit line pairs, LIO and LIOB local input/output line pairs, MIO and MIOB main input/output line pairs, SUB-AMP a sub-amplifier, PC and PC2 precharge circuits, and VS a voltage supply circuit.
Compilation No. PNX10010

DESCRIPTION OF THE EMBODIMENTS

Figure 1A:
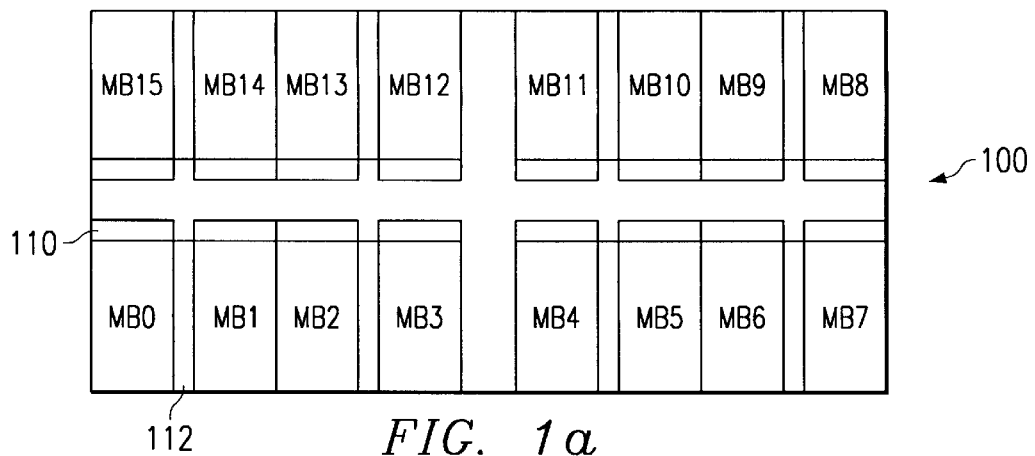
FIG. 1 is a diagram illustrating the chip configuration of a 1 G (giga) bit synchronous dynamic RAM.
Figure 1B:
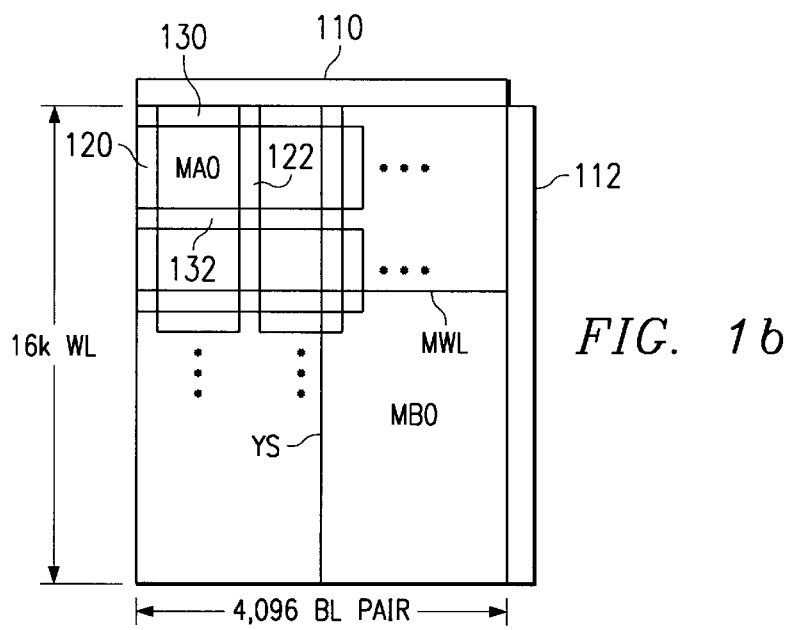

FIG. 1 shows the chip configuration of a 1 G (giga) bit synchronous dynamic RAM. Semiconductor chip 100 of the synchronous dynamic RAM is composed of 16 memory banks MB0–M15 each having a memory capacity of 64M (mega) bit. Each memory bank MB is composed of 256 (8×32) memory arrays MA each having a memory capacity of 256K (kilo) bit. Each memory array MA has 512 subword lines WL and 512 bit line pairs BL. In FIG. 1, 110 represents a column decoder; 112 represents a main word driver (decoder); 120 and 122 represent subword drivers (decoders); and 130 and 132 represent sense amplifier banks.

Column decoder 110 asserts an active state on one YS line out of the 1024 YS lines corresponding to the column address signal. Main word driver 112 asserts an active state on one main word line out of the 2048 main word lines MWL corresponding to the input row address signal. Subword drivers 120 and 122 assert an active state on one subword line out of the 256 subword lines WL corresponding to the active main word line MWL and an FX address signal that is not shown in the figure.

Figure 1C:
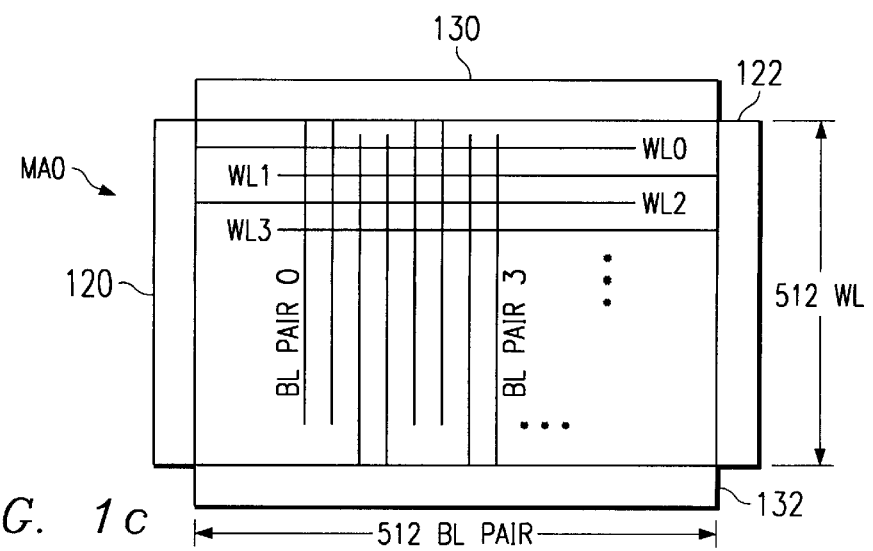

In FIG. 1(c), only one of subword drivers 120 and 122 asserts an active state on one subword line. Each sense amplifier bank 130 and 132 has 256 sense amplifiers SA. Two sense amplifiers SA are selected by the active YS line. Also, sense amplifiers SA in the sense amplifier bank are shared by adjacent memory arrays.

Figure 2:
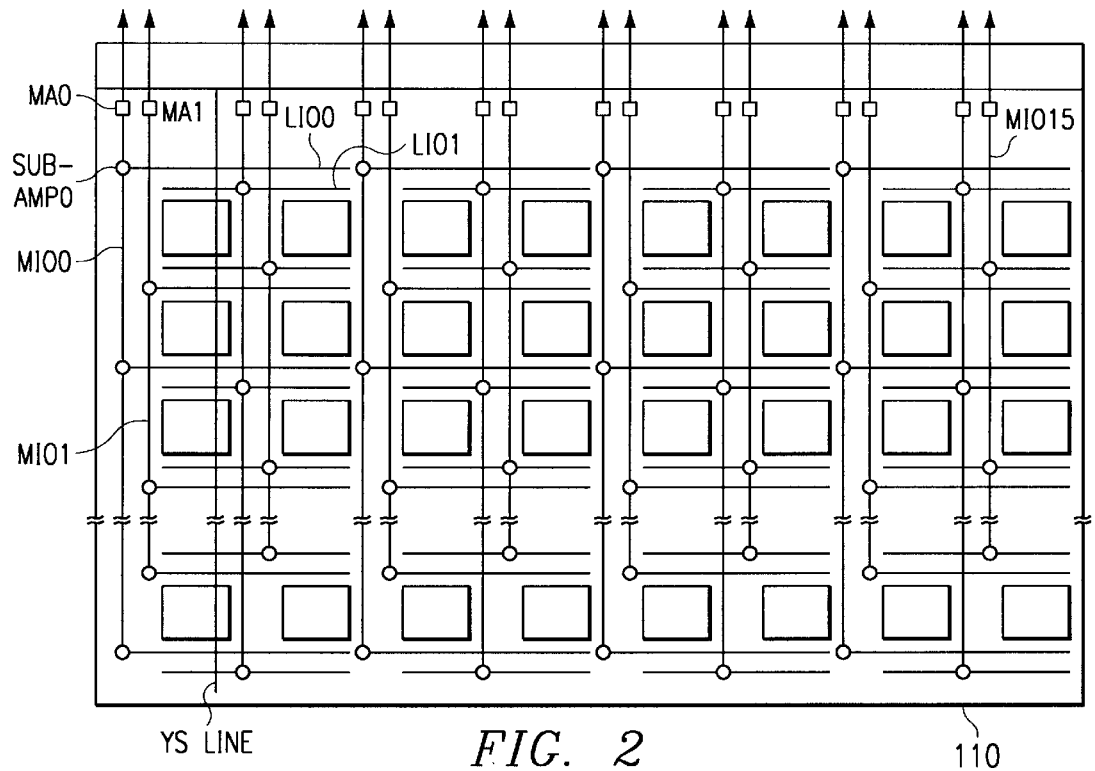
FIG. 2 is a diagram illustrating the configuration of data input/output in memory bank MA0.

FIG. 2 shows the data input/output configuration of memory bank MB0. Memory bank MB has 16 groups of main input/output lines MIO, and each main input/output line MIO is positioned in the region of a subword driver. 32 groups of local input/output lines LIO are connected to each main input/output line MIO via sub-amplifier SUB-AMP. Said local input/output lines LIO are positioned in the region of a sense amplifier bank. Data are output to local input/output lines LIO from sense amplifier SA selected by the YS line. The data are amplified by SUB-AW and output to main input/output lines MIO. Subsequently, the data are amplified by main amplifier MA positioned near column decoder 110 and then output from memory bank MB.

Figure 3:
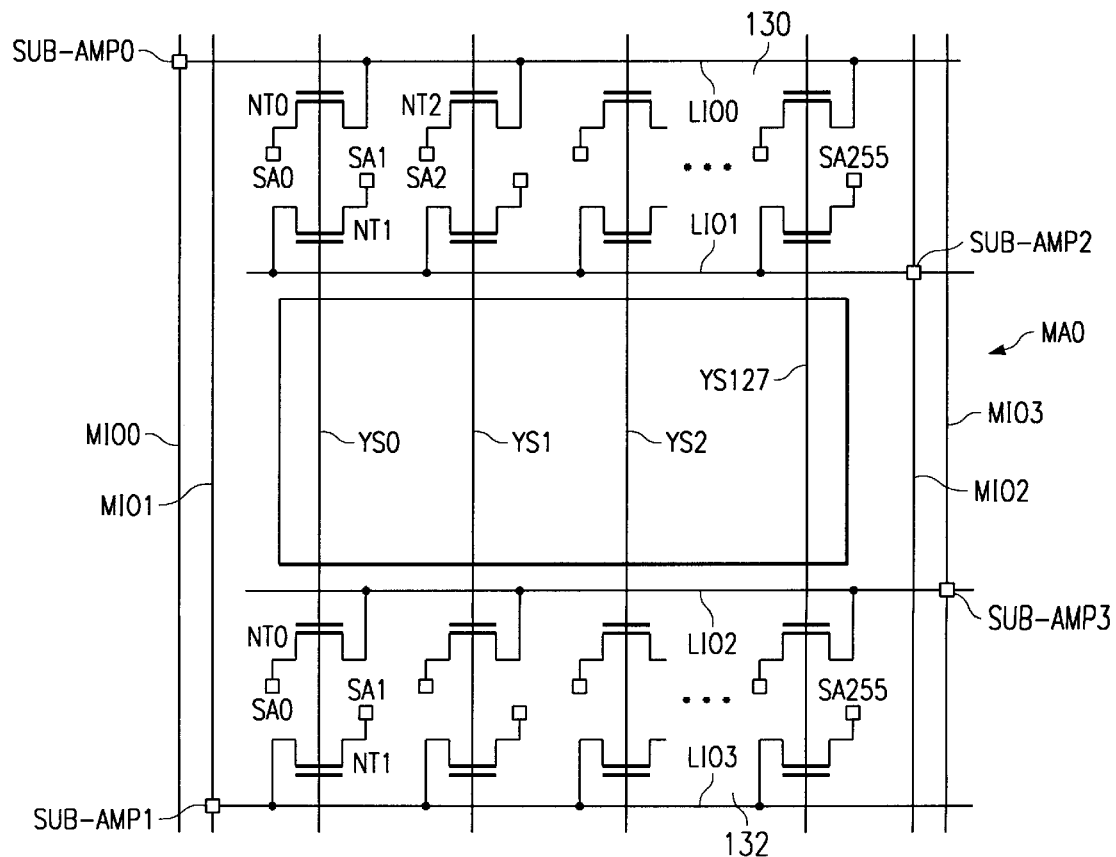
FIG. 3 is a diagram illustrating the connection relationship between sense amplifier SA and local input/output line LIO in memory bank MA0.

FIG. 3 is a diagram illustrating the connection relationship between sense amplifiers SA and local input/output lines LIO. Each sense amplifier bank 130 and 132 has 256 sense amplifiers SA0–SA255. Each sense amplifier SA is connected to one of local input/output lines LIO0–LIO3 via a transfer gate formed by an NMOS transistor NTn.

Local input/output line LIO0 is connected to main input/output line MIO0 via sub-amplifier SUB-AMP0. Local input/output line LIO1 is connected to main input/output line MIO2 via sub-amplifier SUB-AMP2. Local input/output line LIO2 is connected to main input/output line MIO3 via sub-amplifier SUB-AMP3. Local input/output line LIO3 is connected to main input/output line MIO1 via sub-amplifier SUB-AMP1.

Each of 128 YS lines in memory array MA0 controls the operation of four of the aforementioned transfer gates. For example, when YS00 is active, sense amplifiers SA0 and SA1 are connected to local input/output lines LIO0 and LIO1, respectively, in sense amplifier bank 130. Sense amplifiers SA0 and SA1 are connected to local input/output lines LIO2 and LIO3, respectively, in sense amplifier bank 132. Consequently, 4 bits of data are output from one memory array MA0 by means of one active YS line.

In each of the aforementioned figures, both the main input/output line MIO and the local input/output line LIO are indicated by one line. In fact, however, both the main input/output line MIO and the local input/output line LIO are composed of two signal lines, that is, an input/output (signal) line and an auxiliary input/output (signal) line. Illustration of this more complex circuit is omitted for the explanation of the configuration of said memory bank MB and memory array MA.

Figure 4:
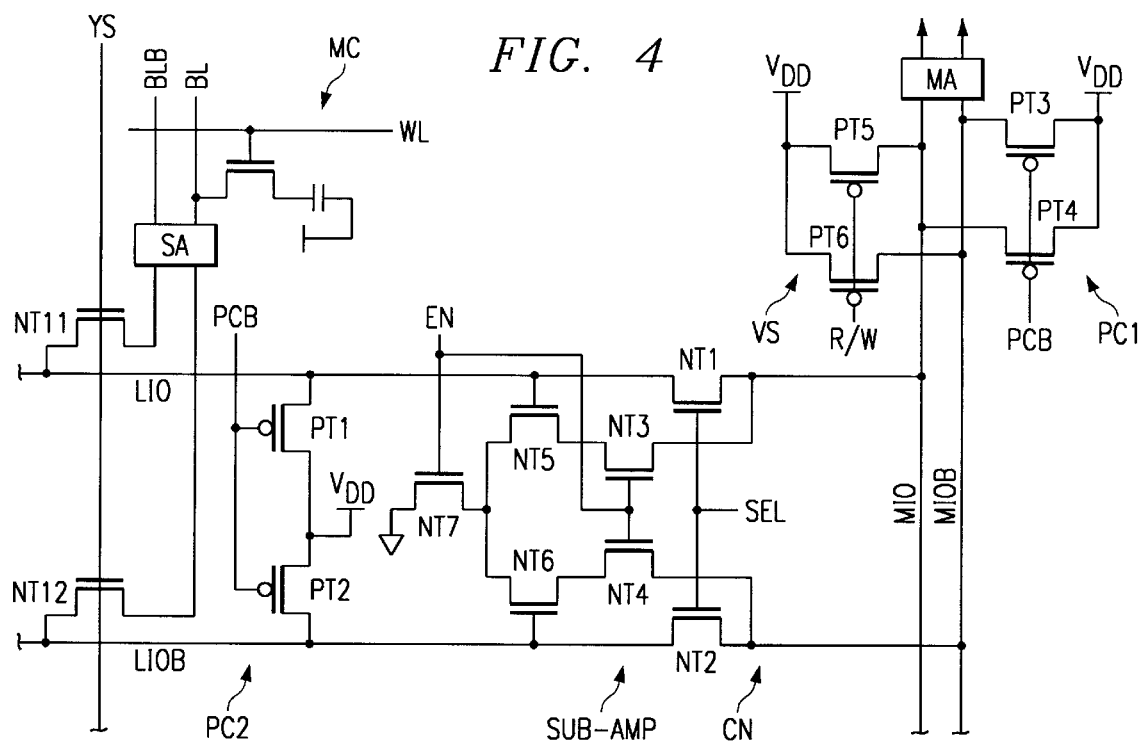
FIG. 4 is a circuit diagram explaining the operation of reading and writing data from and into a memory cell.

In the following, the operation of reading and writing data from and into the memory cells will be explained with reference to FIG. 4.

A main input/output line pair is composed of a main input/output line MIO and an auxiliary main input/output line MIOB. A local input/output line pair is composed of a local input/output line LIO and an auxiliary local input/output line LIOB. A precharge circuit PC1 composed of PMOS transistors PT3 and PT4 and a voltage supply circuit VS composed of PMOS transistors PT5 and PT6 are connected to each other near main amplifier MA of a main input/output line pair. Main input/output line pair MIO, MIOB is connected to local input/output line pair LIO, LIOB via a connection circuit CN formed with NMOS transistors NT1 and NT2.

A sub-amplifier SUB-AMP, which can transfer the potential difference on the local input/output line pair to the main input/output line pair, is formed with five NMOS transistors NT3–NT7. Precharge circuit PC2 composed of PMOS transistors PT1 and PT2 is positioned near the sub-amplifier. A memory cell MC with a 1 transistor/1 capacitor structure is connected to either bit line BL or auxiliary bit fine BLB. Auxiliary bit line BLB is connected to local input/output line LIO via sense amplifier SA and NMOS transistor NT11. Bit line BL is connected to auxiliary local input/output line LIOB via sense amplifier SA and NMOS transistor NT12.

In stand-by mode when no data is being read or written, the precharge signal PCB is low. Precharge circuits PC1 and PC2 operate so that the main input/output line pair MIO, MIOB and local input/output line pair LIO, LIOB are driven to the power voltage level VDD (=1.2 V). Enable signal EN and select signal SEL are also low. Sub-amplifier SUB-AMP and connection circuit CN are in an inactive state. Local input/output line pair LIO, LIOB is electrically isolated from main input/output line pair MIO, MIOB. At that time, bit line pair BL, BLB is precharged to a voltage of VDD/2 by a precharge circuit that is not shown in the figure. In this case, read/write control signal R/W is a signal that varies corresponding to the read mode and write mode. The signal is low during read mode but high during write mode.

First, the operation of reading data from memory cell MC will be explained. A main word line MWL not shown in the figure is driven corresponding to a row address signal. As a result, an active state is asserted on a subword hie WL, and a memory cell MC is connected to a bit line BL. Then, the data stored in the capacitor of memory cell MC is amplified by sense amplifier SA. In this case, if the data stored in memory cell MC is "1", bit line BL and auxiliary bit line BLB are driven to the high level (VDD level) and low level (VSS (−0 V; GND) level), respectively, by sense amplifier SA.

After that, an active state is asserted on a YS line and NMOS transistors NT11 and NT12 are turned on. Auxiliary bit line BLB and bit fine BL are connected to local input/output fine LIO and auxiliary local input/output line LIOB, respectively. At that time, precharge signal PCB is driven to the high level. Also, enable signal EN and select signal SEL are driven to the high level while read/write control signal R/W is held low. Consequently, NMOS transistors NT3, NT4, and NT7 are turned on. Sub-amplifier SUB-AMP is activated, and local input/output line pair LIO, LIOB is connected to main input/output line pair MIO, MIOB.

Since the potential of bit fine BL is high and the potential of auxiliary bit fine BLB is low, the potentials of local input/output line LIO and auxiliary local input/output line LIOB are driven low and high, respectively, by sense amplifier SA. As a result, NMOS transistor NT6 is turned on, and auxiliary main input/output line MIOB is driven low. At that time, PMOS transistor PT6 is turned on, and power voltage VDD is supplied to auxiliary main input/output line MIOB. Consequently, the potential of auxiliary main input/output line MIOB drops gradually.

Main amplifier MA detects the potential difference between main input/output line MIO and auxiliary main input/output line MIOB. When the potential difference reaches about 150 mV, the potentials on main input/output line MIO and auxiliary main input/output line MIOB are sufficient to represent a high level and a low level. Since the data stored in memory cell MC is 1, main in put/output line MIO and auxiliary main input/output line MIOB are driven to the high level and low level, respectively. Then, the result is output from main amplifier MA.

In the following, the operation of writing data into a memory cell MC will be explained. In the write mode, read/write control signal R/W and precharge signal PCB are high. Consequently, voltage supply circuit VS as well as precharge circuits PC1 and PC2 are in an inactive state. A signal corresponding to the data to be written is applied to main input/output line pair MIO, MIOB via main amplifier MA from a driving circuit that is not shown in the figure. For example, when "0" is to be written into memory cell MC, a high-level signal is applied to main input/output line MIO, and a low-level signal is applied to auxiliary main input/output line MIOB.

Then, select signal SEL is driven to the high level. As a result, NMOS transistors NT1 and NT2 are turned on, and main input/output line pair MIO, MIOB is connected to local input/output line pair LIO, LIOB. At that time, since enable signal EN is held low, sub-amplifier SUB-AMP is in the standby state. Main input/output line MIO and local input/output line LIO are driven rapidly to the high level by the aforementioned driving circuit. Also, auxiliary main input/output line MIOB and auxiliary local input/output line LIOB are driven rapidly to the low level.

In this case, sub-bit line WL is driven to the high level, and the transfer gate of memory cell MC becomes conductive. As a result, the capacitor of memory cell MC is electrically connected to bit line BL. Then, when the YS line is driven to the high level, NMOS transistors NT11 and NT12 are turned on, and local input/output line pair LIO, LIOB is connected to bit line pair BLB, BL via sense amplifier SA. Bit line BL is driven to the low level, and auxiliary bit line BLB is driven to the high level. Consequently, the low-level potential is transferred to the capacitor of memory cell MC. The data is written into memory cell MC by the aforementioned series of operations.

Figure 5:
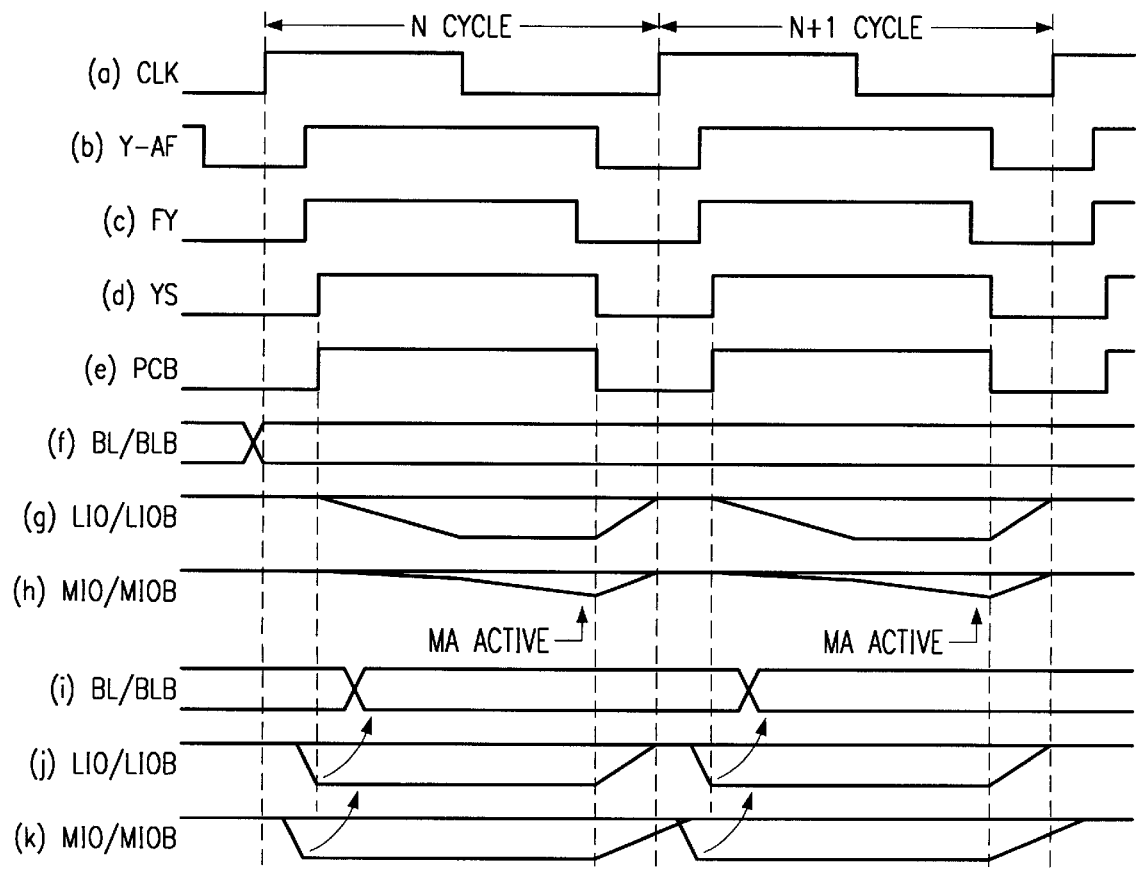
FIG. 5 is a diagram illustrating the waveform of each signal line in the operation of reading and writing data from and into a memory cell.

FIG. 5 shows the waveform of each signal line during the operation of reading and writing data from and into a memory cell MC in the burst mode.

In FIG. 5, ($a$) represents an external clock signal CLK; ($b$) represents an internal signal Y-AF (Y Active Factor) generated from clock signal CLK; ($c$) represents an internal signal FY generated from internal signal Y-AF; ($d$) represents an YS signal generated from signal FY; and ($e$) represents a precharge signal PCB in the same phase as the YS signal. FIGS. 5($f$), 5($g$), and 5($h$) illustrate the signal waveforms of bit line pair BL, BLB, local input/output line pair LIO, LIOB, and main input/output line pair MIO, MIOB during a data read operation, respectively. FIGS. 5($i$), 5($j$), and 5($k$) illustrate the signal waveforms of bit line pair BL, BLB, local input/output line pair LIO, LIOB, and main input/output line pair MIO, MIOB during a data write operation. In this case, the frequency of clock signal CLK is 125 MHz and one period is 8 ns.

In a data read operation, precharge of local input/output line pair LIO, LIOB and main input/output line pair MIO, MIOB is terminated at the same time when an active state is asserted on the YS signal (YS line). Then, the voltage of bit line pair BLB, BL determined by sense amplifier SA is output to local input/output line pair LIO, LIOB, amplified by sub-amplifier SUB-AMP, and output to main input/output line pair MIO, MIOB.

In the present invention, to increase the speed of the data read operation, the amplitude of the main input/output line pair is reduced, and the amplification factor of sub-amplifier SUB-AMP is kept smaller than 1. Main amplifier MA is activated 0.5–1 ns before precharge signal PCB is driven to the low level in order to amplify and output the potential difference on the main input/output line pair MIO, MIOB. A potential difference of 150 mV is required for main amplifier MA to correctly detect the potential difference of main input/output line pair MIO, MIOB.

In this case, local input/output line pair LIO, LIOB is driven by sense amplifier SA to the high level and low level, respectively. However, since the amplitude of main input/output line pair MIO, MIOB is reduced, the minimum potential of the local input/output line will not reach all the way to the low level and its maximum potential will be a little lower than the high level. The difference in the potential from the high level can be, for example, several hundred mV. Consequently, when data is output from main amplifier MA, main input/output line pair MIO, MIOB should be precharged quickly to the VDD level by precharge circuit PC1.

In a data write operation, precharge of main input/output line pair MIO, MIOB and local input/output line pair LIO, LIOB is terminated after precharge signal PCB is driven to the high level. Then, main input/output line pair MIO, MIOB is driven to the high level and low level, respectively, by a driving circuit not shown in the figure. Select signal SEL is driven to the high level. As a result, NMOS transistors MT1 [sic; NT1] and NT2 are turned on.

Then, the voltage of main input/output line pair MIO, MIOB is supplied to local input/output line LIO, LIOB, and an active state is asserted on the YS line. As a result, NMOS transistors NT11 and NT12 are turned on. At that time, the voltage of local input/output line pair LIO, LIOB is supplied to memory cell MC via bit line BL, BLB, and the voltage corresponding to the data to be written is transferred to the capacitor of memory cell MC.

In each operation cycle of the aforementioned data read operation and data write operation, data are transferred (read or written) after local input/output line pair LIO, LIOB and main input/output line pair MIO, MIOB are precharged to the VDD level. The timing of the precharge is controlled by an internal signal FY that is used to generate the YS signal. Also, in a data write operation, the time needed for precharging local input/output line pair LIO, LIOB to the VDD level is different from that needed for main input/output line pair MIO, MIOB. This is caused by the difference in the driving ability between precharge circuits PC1 and PC2 and the difference in the wiring capacity between local input/output line pair LIO, LIOB and main input/output line pair MIO, MIOB.

Figure 6A:
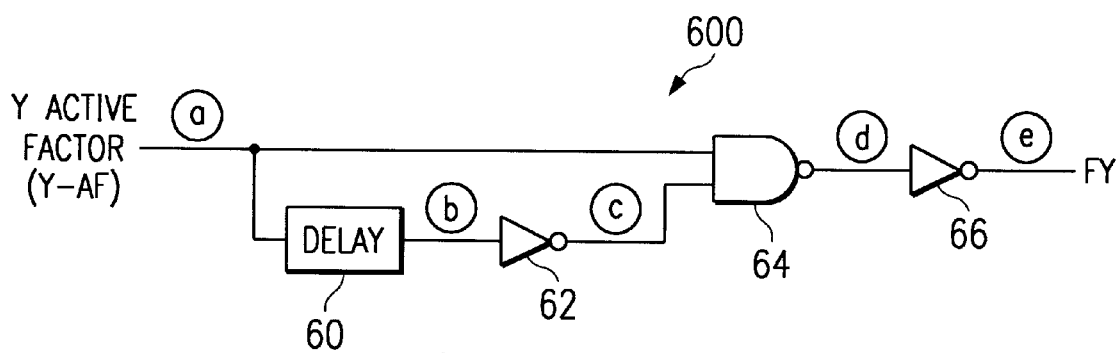
FIG. 6 is a circuit diagram illustrating a circuit used for generating the internal signal FY.
Figure 6B:
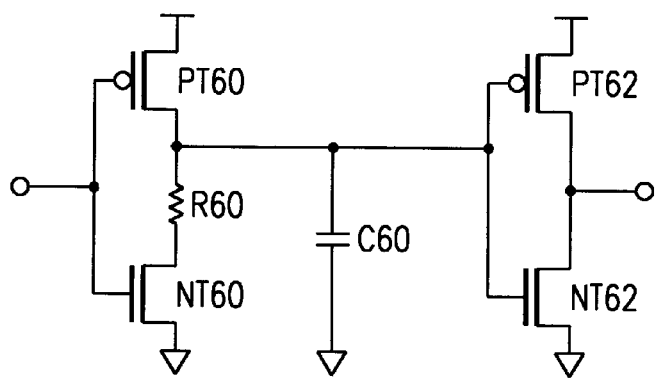

FIG. 6 is a circuit diagram illustrating the circuit for generating the internal signal FY. FY signal generator 600 contains delay circuit 60, inverters 62 and 66, and 2-input NAND circuit 64. Signal FY is generated based on internal signal Y-AF generated from clock signal CLK. Delay circuit 60 contains an inverter formed by PMOS transistor PT60 and NMOS transistor NT60, another inverter formed by PMOS transistor PT62 and NMOS transistor NT62, resistor R60, and capacitor C60. The time delay corresponding to the resistance of resistor R60 and the electrostatic capacity of capacitor C60 is applied to signal Y-AF and is output to inverter 62. The pulse width (high level) of signal FY is determined by the time delay of delay circuit 60 when the internal delays of inverters 62 and 66 as well as NAND circuit 64 are ignored.

Figure 7:
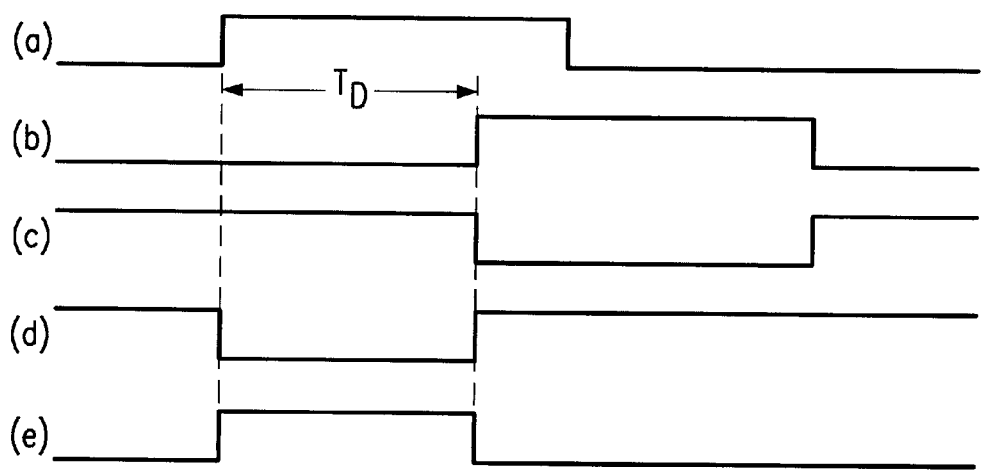
FIG. 7 is a diagram illustrating the waveform of each signal in FY signal generator circuit (600).

FIG. 7 shows the wavelength of each signal in FY signal generator 600. Delay circuit 60 applies time delay TD to signal Y-AF and outputs it to inverter 62. Inverter 60 [sic; 62] inverts the input signal and outputs the inverted signal to NAND circuit 64. NAND circuit 64 performs a NAND operation on signal F-AF [sic; Y-AF] and the signal output from inverter 62 and outputs the result to inverter 66. Then, inverter 66 inverts the output signal of NAND circuit 64 and outputs signal FY. As a result, the pulse width of the part of the signal FY that is high is determined by time delay TD of delay circuit 60.

Signal FY generated by FY signal generator is supplied to column decoder 110. Column decoder 110 generates a YS signal depending on the input column address signal and signal FY. The pulse width of the part of the signal that is FY high is almost the same as that of the YS signal. As shown in FIG. 5, however, its phase lags as compared with that of the YS signal. Also, precharge signal PCB, which is synchronized with the YS signal, is also generated based on signal FY by a precharge signal generator that is not shown in the figure.

Figure 8:
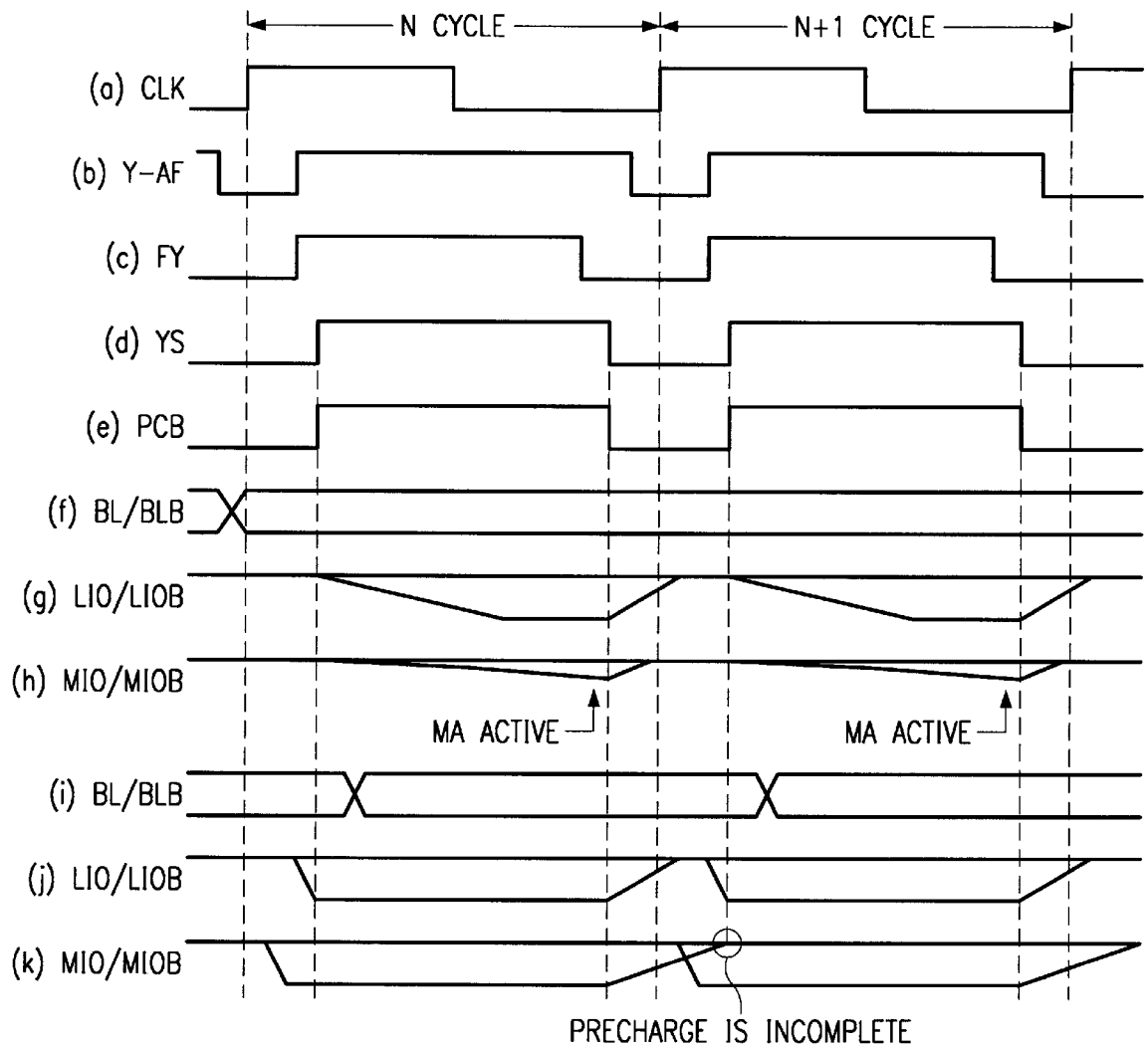
FIG. 8 is a diagram illustrating the waveform of each signal line in the operation of reading and writing data from and into a memory cell.

FIG. 8 shows the waveform of each signal line during an operation of reading data from a memory cell MC and during an operation of writing data into a memory cell MC when the frequency of clock signal CLK is 143 MHz. In this case, one period of clock signal CLK is about 7 ns. When the frequency of clock signal CLK is increased, the pulse width of internal signal Y-AF is reduced. As a result, the pulse widths of the parts of the signals FY and YS that are high become shorter. In addition, the pulse width of the part of the precharge signal PCB that is low is reduced.

In a data read operation, when the pulse width of the part of the YS signal that is high becomes shorter, the time that is needed to transfer the high-level and low-level voltages of bit line pair BL, BLB discriminated by sense amplifier SA to local input/output line pair LIO, LIOB and main input/output line pair MIO, MIOB becomes insufficient. As a result, main amplifier MA might be activated before the voltage difference of main input/output line pair MIO, MIOB reaches a level that can be detected by main amplifier MA. As a result, main amplifier MA may not be able to detect the data correctly. In the present example, a voltage difference of about 150 mV at main input/output line pair MIO, MIOB is needed for main amplifier MA to detect the data correctly. However, as shown in FIG. 8, main amplifier MA is activated before the voltage difference of main input/output line pair MIO, MIOB reaches 150 mV.

In a data write operation, the time needed to precharge main input/output line pair MIO, MIOB to the VDD level also becomes insufficient. In other words, the period for the precharge signal to stay low becomes shorter. As shown in FIG. 8(*k*), main input/output line pair MIO, MIOB may not be precharged completely before the YS signal is activated. In this case, no problem will occur if the data are written continuously. However, if data are read immediately after they are written, the data may not be read correctly due to the insufficient precharge of main input/output line pair MIO, MIOB.

Figure 9A:
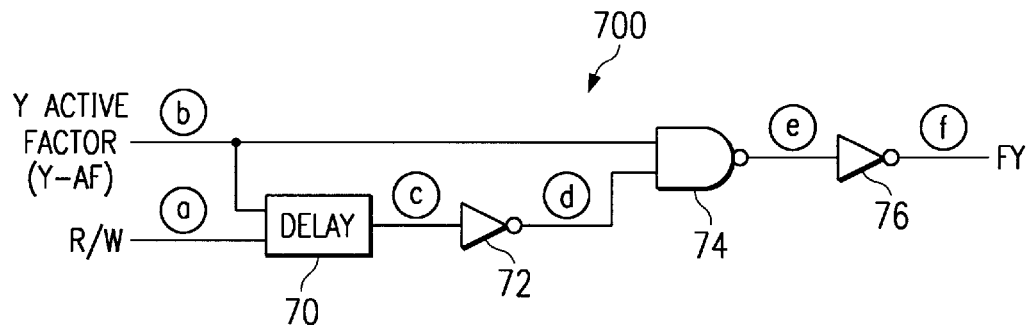
FIG. 9 is a circuit diagram illustrating the circuit used in the present invention to generate the internal signal FY.

FIG. 9 shows the FY signal generator used in the present invention. Said FY signal generator 700 contains delay circuit 70, inverters 72 and 76, and NAND circuit 74. Said delay circuit 70 is designed appropriately so that the time delay is able to vary depending on an external read/write control signal R/W. FIG. 9(*b*) shows an example of delay circuit (70). Said delay circuit (70A) contains PMOS transistors PT70 and PT72, NMOS transistors NT70, NT72, and NT77, capacitor C70, as well as resistors R70 and R72.

The source of PMOS transistor PT70 is connected to power voltage VCC, and the source of NMOS transistor NT70 is connected to ground. Resistors R70 and R72 are connected in series between the drain of PMOS transistor PT70 and the drain of NMOS transistor NT70. Resistor R72 is connected between the drain and source of NMOS transistor NT77. The source of PMOS transistor PT72 is connected to power voltage VCC, and the source of NMOS transistor NT72 is connected to ground. Output signal OUT is output from the node connecting the drain of PMOS transistor PT72 and the drain of NMOS transistor NT72. The node connecting the gate of PMOS transistor PT72 and the gate of NMOS transistor NT72 is connected to the drain of PMOS transistor PT70. Capacitor C70 is connected between the aforementioned node and ground.

Input signal IN is input to the node connecting the gate of PMOS transistor PT70 and the gate of NMOS transistor NT70. Read/write control signal R/W is applied to the gate of NMOS transistor NT77 to control the operation of NMOS transistor NT77. The time delay of delay circuit 70A is determined by the electrostatic capacitance of capacitor C70 and the resistance of resistors R70 and R72. However, there are two operating states for NMOS transistor NT77 connected across resistor R72 depending on the logic level of read/write control signal R/W. When NMOS transistor NT77 is turned on, resistor R72 is bypassed, and the resistance between the drain of PMOS transistor PT70 and the drain of NMOS transistor NT70 is reduced.

When read/write control signal R/W is high, NMOS transistor NT77 is turned on. When read/write control signal R/W is low, NMOS transistor NT77 is turned off. Consequently, when read/write control signal R/W is high, the time delay is shorter than the delay when read/write control signal R/W is low.

Figure 10:
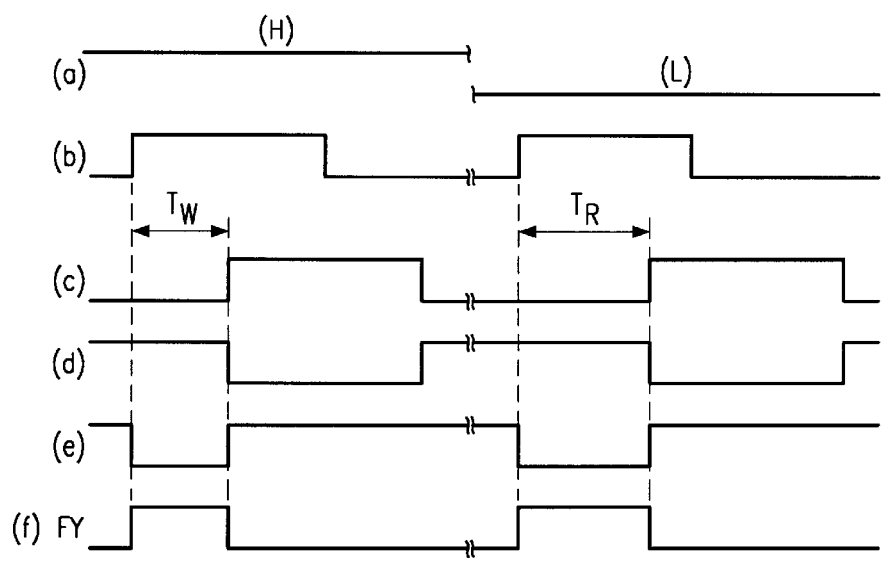
FIG. 10 is a diagram illustrating the waveform of each signal in FY signal generator circuit (700).

FIG. 10 shows the waveform of each signal in FY signal generator 700. As shown in FIG. 10(*c*), when read/write control signal R/W is high as shown in (*a*), time delay TW of delay circuit 70 is shorter than time delay TR of delay circuit 70 when read/write control signal R/W is low. Consequently, when read/write control signal R/W is high, the pulse width of the part of the FY signal (FIG. 10(*f*)) that is high is shorter than the pulse width of the part of the FY signal that is high when read/write control signal R/W is low.

Figure 9B:
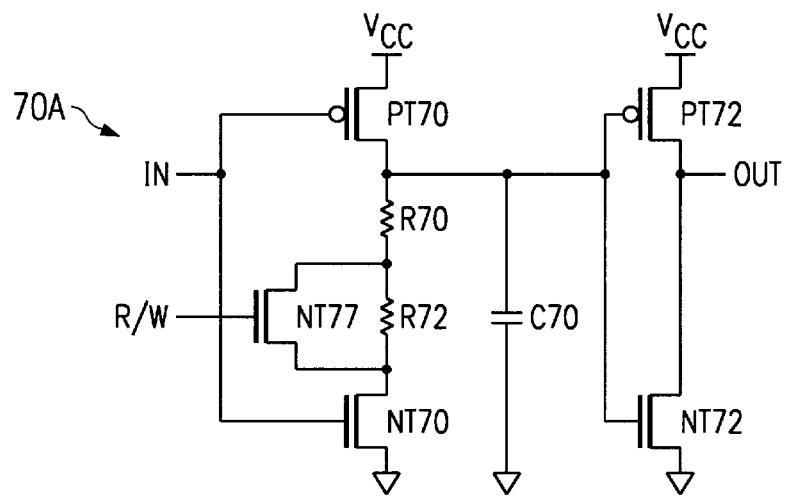
Figure 9C:
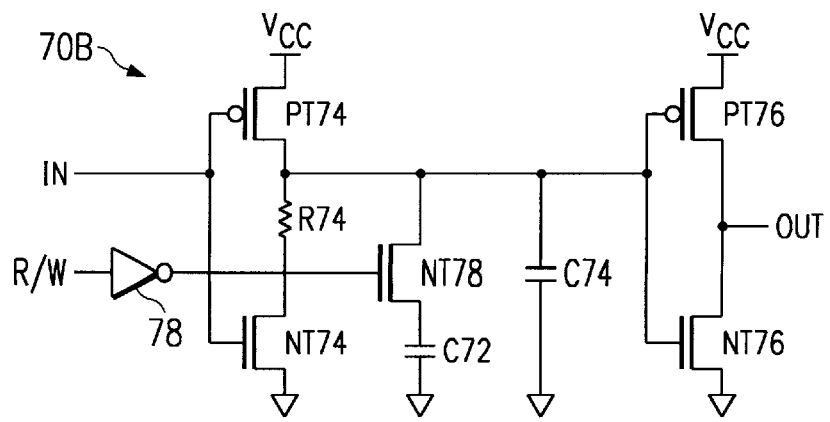

FIG. 9(c) shows another example of delay circuit 70. Said delay circuit 70B contains PMOS transistors PT74 and PT76, NMOS transistors NT74, NT76, and NT78, capacitors C72 and C74, resistor R74, as well as inverter 78. The source of PMOS transistor PT74 is connected to power voltage VCC. The source of NMOS transistor NT74 is connected to ground. Resistor R74 is connected between the drain of PMOS transistor PT74 and the drain of NMOS transistor NT74.

The source of PMOS transistor PT76 is connected to power voltage VCC, and the source of NMOS transistor NT76 is connected to ground. The drains of these transistors are connected to each other. Output signal OUT is output from the node connecting the drains. The node connecting the gate of PMOS transistor PT76 and the gate of NMOS transistor NT76 is connected to the drain of PMOS transistor PT74, and capacitor C74 is connected between the aforementioned node and ground. NMOS transistor NT78 and capacitor C72 are connected in series between the aforementioned node and ground. Read/write control signal R/W is applied to the gate of NMOS transistor NT78 via inverter 78. Input signal IN is input to the node connecting the gate of PMOS transistor PT74 and the gate of NMOS transistor NT74.

The time delay of said delay circuit 70B is determined by the electrostatic capacitance of capacitors C72 and C74 and by the resistance of resistor R74 and has two stakes depending on the operating state of NMOS transistor NT78. When NMOS transistor NT78 is turned on, capacitor C72 is connected in parallel with capacitor C74. When NMOS transistor NT78 is turned off, capacitor C72 is isolated from capacitor C74. Consequently, the electrostatic capacitance connected to the input terminal of the inverter formed by PMOS transistor PT76 and NMOS transistor NT76 varies depending on the operating state of NMOS transistor NT78. Therefore, the time delay of delay circuit 70B varies depending on the operating state of NMOS transistor NT78.

When read/write control signal R/W is high, NMOS transistor NT78 is turned off. When read/write control signal R/W is low, NMOS transistor NT77 is turned on. Consequently, when read/write control signal R/W is high, the time delay is shorter than the delay when read/write control signal R/W is low. The waveform of each signal when the delay circuit 70B shown in FIG. 9(c) is used as the delay circuit 70 of FY signal generator 700 is identical to the case shown in FIG. 10 when the delay circuit 70A shown in FIG. 9(b) is used if its time delay is the same as that of delay circuit 70A shown in FIG. 9(b).

Figure 11:
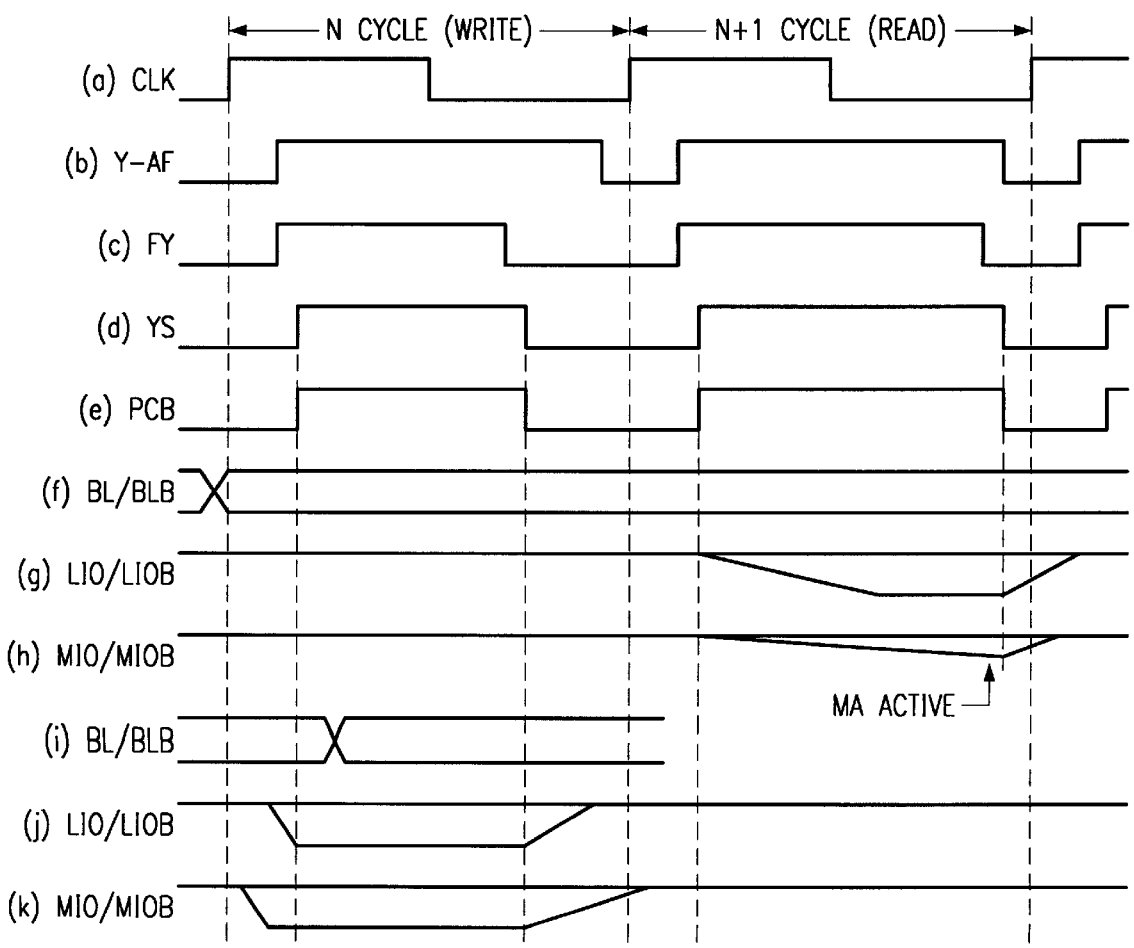
FIG. 11 is a diagram illustrating the waveform of each signal line in an operation of reading data from memory cell MC and in an operation of writing data into memory cell MC when said FY signal generator 700 is used.

FIG. 11 shows the waveform of each signal line during an operation of reading data from memory cell MC and during an operation of writing data into memory cell MC when said FY signal generator 700 is used. The frequency of clock signal CLK in this case is 143 MHz, which is the same as the case shown in FIG. 8. As shown in FIG. 11(c), the pulse width of the part of the FY signal that is high is short in the data write operation (Write) and becomes longer in the data read operation (Read). As a result, the YS signal generated from the FY signal is also short in the data write operation (Write) and becomes longer in the data read operation (Read). Precharge signal PCB has the same waveform as the YS signal.

Consequently, in the data write operation, the precharge time is sufficient. Therefore, the precharge of main input/output line pair MIO, MIOB is completed before the YS signal of the next cycle is activated. In the data read operation, since the pulse width of the part of the YS signal that is high becomes longer, a potential difference that can be detected by main amplifier MA, such as 150 mV, is present at main input/output line pair MIO, MIOB. Consequently, even if the cycles of the data read and write operations become shorter as a result of the increase in the frequency of clock signal CLK, data can still be read correctly.

When the FY signal generator of the present invention is used, in a data write operation, the time used to assert an active signal on the YS line is shortened, and the precharge time used for precharging the local input/output line pair and the main input/output line pair to a prescribed voltage (VDD) is prolonged. Therefore, the local input/output line pair and the main input/output line pair can be fully precharged, which prevents adverse effects on the next read operation. In a data read operation, since the time used to assert an active signal on the YS line is prolonged, the time for transferring the data of the bit line pair to the local input/output line pair and the main input/output line pair can be prolonged, and the potential difference present at the main input/output line pair can be discriminated correctly by the main amplifier. Consequently, data can be read or written in synchronization with a high-speed external clock signal.

The circuit configuration of said delay circuit 70 is not limited to the circuits shown in FIGS. 9(b) and 9(c). It is also possible to use a delay circuit that can vary the time delay corresponding to the read/write control signal R/W. Also, delay circuits 70A and 70B shown in FIG. 9 are not limited to the circuit configurations shown in FIG. 9. For example, in FIG. 9(b), it is also possible to connect other resistors in parallel with resistor R72. The resistors can be connected using metal op-amps, etc. In this way, the time to assert an active signal on the YS line can be set in an optimum way for the data read and write operations. In FIG. 9(c), it is also possible to connect other capacitors in parallel with capacitor C72.

Figure 12A:
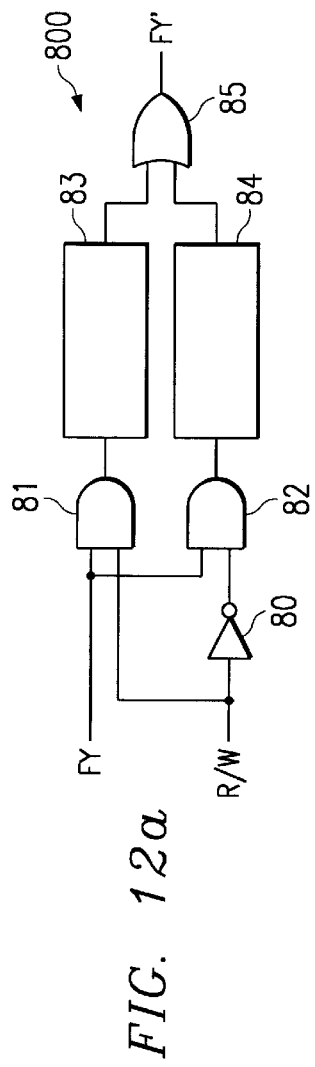
FIG. 12 is a circuit diagram illustrating the FY signal adjusting circuit used in the present invention.

FIG. 12 is a circuit diagram illustrating the FY signal adjusting circuit used in the present invention. Said FY signal adjusting circuit 800 contains inverter 80, AND circuits 81 and 82, write timing adjusting circuit 83, read timing adjusting circuit 84, and OR circuit 85. An FY signal having the same pulse width in both the read and write operations and a read/write control signal R/W are input into the FY signal adjusting circuit that outputs an FY' signal having different pulse widths in the read and write operations. The signal output from FY signal generator 600 shown in FIG. 6 can be used as the FY signal.

Read/write control signal R/W is low during a read operation and is high during a write operation. Therefore, the FY signal is supplied to read timing adjusting circuit 84 when read/write control signal R/W is low and to write timing adjusting circuit 83 when read/write control signal R/W is high by means of inverter 80 as well as AND circuits 81 and 82. The output signals of write timing adjusting circuit 83 and read timing adjusting circuit 84 are output to OR circuit 85. However, when the level of one of the signals varies, the other signal is held low. Consequently, either of the output signals can be output from OR circuit 85 as the FY' signal with an adjusted pulse width.

Figure 12B:
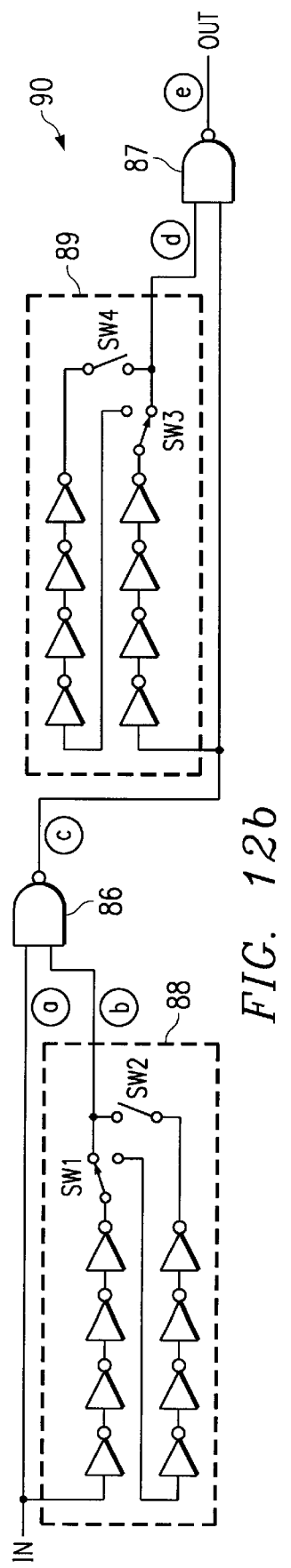

Write timing adjusting circuit 83 and read timing adjusting circuit 84 have the same circuit configuration. The circuit is shown in FIG. 12(b). Said timing adjusting circuit 90 contains NAND circuits 86 and 87 as well as delay circuits 88 and 89. Each delay circuit 88 and 89 has two delay stages that are each formed by connecting four inverters in series. The delay stages can be doubled in length by means of SW1 and SW2 or SW3 and SW4. Consequently, the time delay of delay circuits 88 and 89 can be varied by appropriately controlling the connection state of SW1 and SW2 or SW3 and SW4. The circuit configuration of said delay circuits 88 and 89 is just one example. It is also possible to use other delay means as long as the time delay can be varied. For example, a circuit containing resistors and capacitors can also be used. In addition, it is also possible to use three or more delay stages that contain four inverters connected in series.

Figure 13:
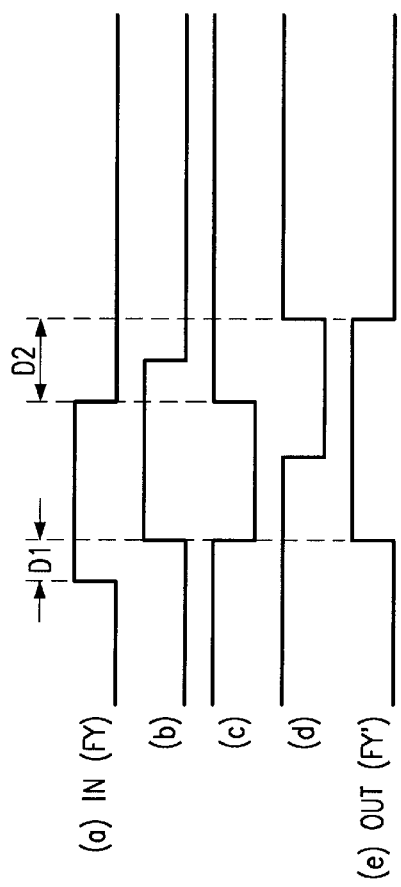
FIG. 13 is a diagram illustrating the waveform of each signal in timing adjusting circuit 90.

FIG. 13 shows the waveform of each signal in timing adjusting circuit 90. Delay circuit 88 applies time delay D1 to input signal IN and outputs the delayed signal to NAND circuit 86. Delay circuit 89 applies time delay D2 to the output signal of NAND circuit 86 and outputs the delayed signal to NAND circuit 87. Consequently, the leading edge of output signal OUT of timing adjusting circuit 90 is delayed by time D1 with respect to input signal IN, and the trailing edge of the aforementioned output signal is delayed by time D2 with respect to input signal IN. In other words, the leading edge of output signal OUT can be adjusted by adjusting time delay D1 of delay circuit 88, and the trailing edge of output signal OUT can be adjusted by adjusting time delay D2 of delay circuit 89.

Time delay D1 of delay circuit 88 is set longer and time delay D2 of delay circuit 89 is set shorter in write timing adjusting circuit 83. In this way, an FY' signal with a short pulse width at the high level can be obtained. Time delay D1 of delay circuit 88 is set shorter and time delay D2 of delay circuit 89 is set longer in read timing adjusting circuit 84. In this way, an FY' signal with a long pulse width at the high level can be obtained. When the FY' signal is used to generate the YS signal, a YS signal with a short pulse width at the high level in a data write operation and with a long pulse width at the high level in a data read operation can be obtained. Consequently, data can be read and written in synchronization with a high-frequency clock signal CLK.

When said FY signal adjusting circuit 800 is used, the waveforms of the signals in an operation of reading data from memory cell MC and in an operation of writing data into memory cell MC are almost the same as those shown in FIG. 11.

The optimum application example of the present invention is explained above. However, it is obvious to those skilled in the art that various modifications can be made based on the main point of the present invention. For example, the time delay of the aforementioned delay circuit can be set in an arbitrary manner, and data can be read and written in synchronization with a clock signal CLK with a high frequency of 150 MHz or even higher.

As explained above, according to the present invention, in a semiconductor memory device that reads or writes data in synchronization with a clock signal, a sufficiently high potential difference can be asserted on the input/output line pair by prolonging the time used for connecting the input/output line pair (local input/output line pair and main input/output line pair) to the bit line pair discriminated by a sense amplifier in a data read operation. Also, the input/output line pair can be completely precharged by prolonging the precharge time of the input/output line pair in a data write operation. Consequently, data can be read correctly even when the read and write operations are carried out in synchronization with a high-speed clock signal.

What is claimed is:

1. Semiconductor memory device comprising a memory array composed of plural memory cells arranged at positions where plural bit line pairs cross plural word lines, plural sense amplifiers electrically connected to the plural bit line pairs, respectively, for determining the potential difference between the bit line pairs, input/output line pairs that are used to transfer the data read from the memory cells and the data to be written into the memory cells, plural first switch circuits that electrically connect the plural sense amplifiers to the input/output line pairs, respectively, a timing control signal generator for generating a timing control signal, a row decoder circuit that activates one of the plural word lines corresponding to a row address signal, and a column decoder circuit that provides a column select signal for selecting a first switch circuit from the plural first switch circuits corresponding to the timing control signal and a column address signal; said timing control signal generator generating a timing control signal during a data write operation, having a pulse width that it is shorter than the pulse width of a timing control signal during a data read operation; during a data write operation, the width of the pulse used to activate the column select signal is shorter than the width of the pulse used to activate the column select signal during a data read operation.

2. The semiconductor memory device described in claim 1 further comprising a precharge circuit for precharging the input/output line pairs to a prescribed voltage when the column select signal is not activated, and an amplifying circuit for amplifying the potential difference on the input/output line pairs.

3. The semiconductor memory device described in claim 2 wherein the input/output line pairs include a first input/output line pair connected to the sense amplifier via the first switch circuit, and a second input/output line pair electrically connected to a local input/output line pair via a second switch circuit; the precharge circuit having a first precharge circuit for precharging the first input/output line pair to a prescribed voltage, and a second precharge circuit for precharging the second input/output line pair to a prescribed voltage; the amplifying circuit being connected to the second input/output line pair.

4. The semiconductor memory device described in claim 3 further comprising a sense circuit for transferring the potential difference on the first input/output line pair to the second input/output line pair.

5. The semiconductor memory device described in claim 1, wherein the timing control signal is generated according to an external clock signal.

6. The semiconductor memory device described in claim 2, wherein the timing control signal is generated according to an external clock signal.

7. The semiconductor memory device described in claim 3 wherein the timing control signal is generated according to an external clock signal.

8. The semiconductor memory device described in claim 4 wherein the timing control signal is generated according to an external clock signal.

* * * * *